(12) United States Patent
Sano

(10) Patent No.: US 9,368,889 B2
(45) Date of Patent: Jun. 14, 2016

(54) SOCKET FOR REDUCING SIZE AND OPERATING FORCE

(71) Applicant: Sensata Technologies Massachusetts Incorporated, Attleboro, MA (US)

(72) Inventor: Hideki Sano, Shizuoka (JP)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 14/566,760

(22) Filed: Dec. 11, 2014

(65) Prior Publication Data

US 2015/0171530 A1    Jun. 18, 2015

(30) Foreign Application Priority Data

Dec. 11, 2013 (JP) .................. 2013-255596

(51) Int. Cl.
| H05K 1/00 | (2006.01) |
|---|---|
| H01R 12/71 | (2011.01) |
| G01R 1/04 | (2006.01) |
| H05K 7/10 | (2006.01) |
| H01R 13/627 | (2006.01) |
| H01R 13/629 | (2006.01) |

(52) U.S. Cl.
CPC ............ H01R 12/714 (2013.01); G01R 1/0466 (2013.01); G01R 1/0483 (2013.01); H01R 13/6273 (2013.01); H01R 13/62905 (2013.01); H05K 7/1061 (2013.01)

(58) Field of Classification Search
CPC ............................ H01R 23/722; H05K 7/1084
USPC .............. 439/70, 73, 525, 264, 268, 330, 331
See application file for complete search history.

(56) References Cited

U.S. PATENT DOCUMENTS

| 6,666,691 | B2* | 12/2003 | Ikeya .................... | H05K 7/1069 439/268 |
|---|---|---|---|---|
| 6,790,065 | B2* | 9/2004 | Fukunaga ............ | G01R 1/0483 439/266 |
| 6,848,928 | B2* | 2/2005 | Ikeya .................... | G01R 1/0483 439/330 |
| 7,666,016 | B2* | 2/2010 | Kobayashi ........... | H05K 7/1061 439/296 |
| 7,887,355 | B2* | 2/2011 | Watanabe ............ | H05K 7/1061 439/331 |
| 8,388,365 | B2* | 3/2013 | Takahashi .......... | H01R 12/7082 439/331 |
| 8,535,079 | B2* | 9/2013 | Wang .................... | H05K 7/1007 439/331 |
| 2003/0109163 | A1* | 6/2003 | Shimada .............. | H05K 7/1084 439/331 |
| 2005/0233614 | A1* | 10/2005 | Gattuso ................ | G01R 1/0433 439/70 |
| 2011/0201221 | A1* | 8/2011 | Kobayashi ........... | H05K 7/1061 439/331 |

* cited by examiner

*Primary Examiner* — Abdullah Riyami
*Assistant Examiner* — Thang Nguyen
(74) *Attorney, Agent, or Firm* — Chapin IP Law, LLC

(57) ABSTRACT

A socket according to the present invention comprises a base member for holding a plurality of contacts, a cover member and a latch mechanism for pressing a semiconductor package. A latch member has a pressing portion, a link member connected to the cover member and pressing portion of the latch member, a lever member rotatably fixed to the base member and connected with the cover member at a first end and with a narrow portion of the cover member at a second end. The link member and the lever member cause the pressing portion of the latch member to move to an evacuated position when the cover member moves in a direction to be close to the base member, while the link member and the lever member cause the pressing portion of the latch member to move to a position where an electronic device can be pressed.

20 Claims, 17 Drawing Sheets 10 conventional socket

PRIOR ART

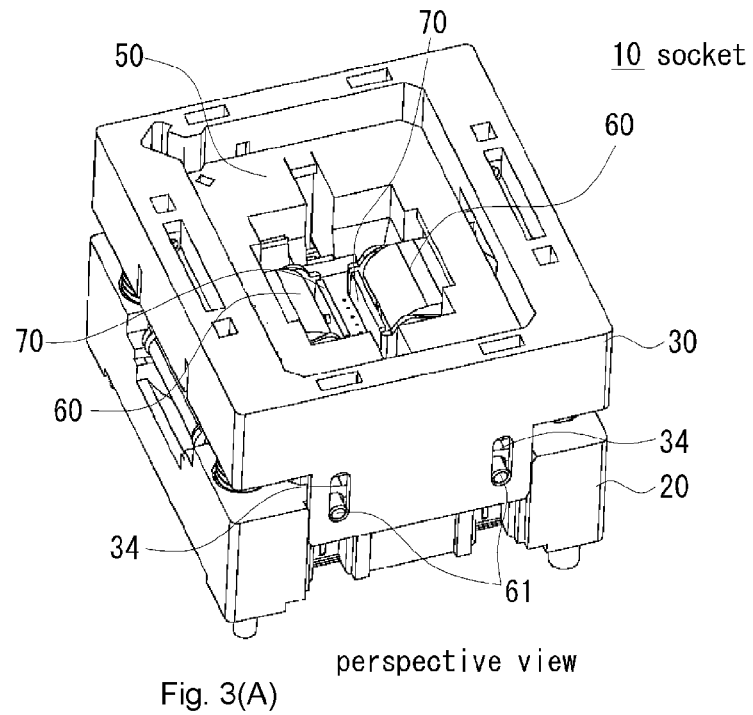
Fig. 3(A) perspective view
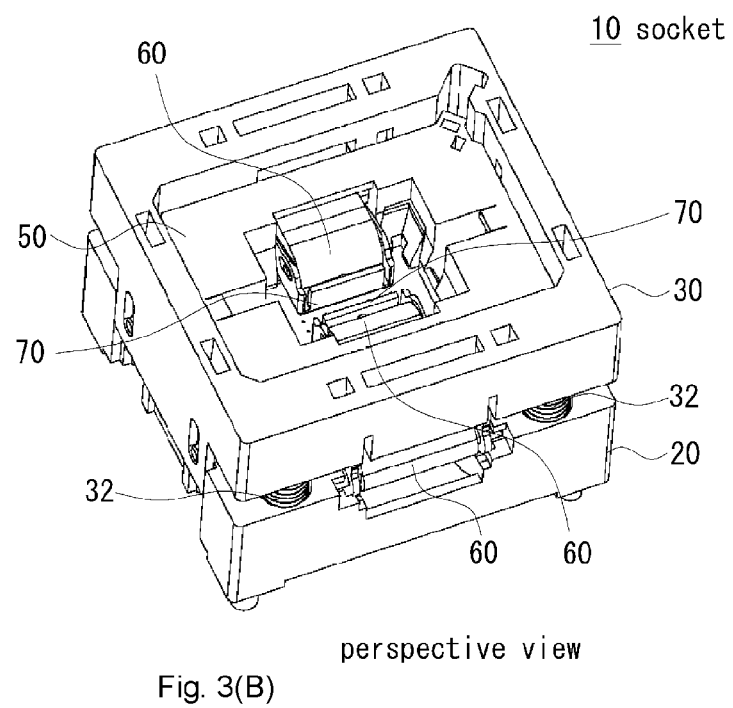
Fig. 3(B) perspective view
PRIOR ART Section A-A

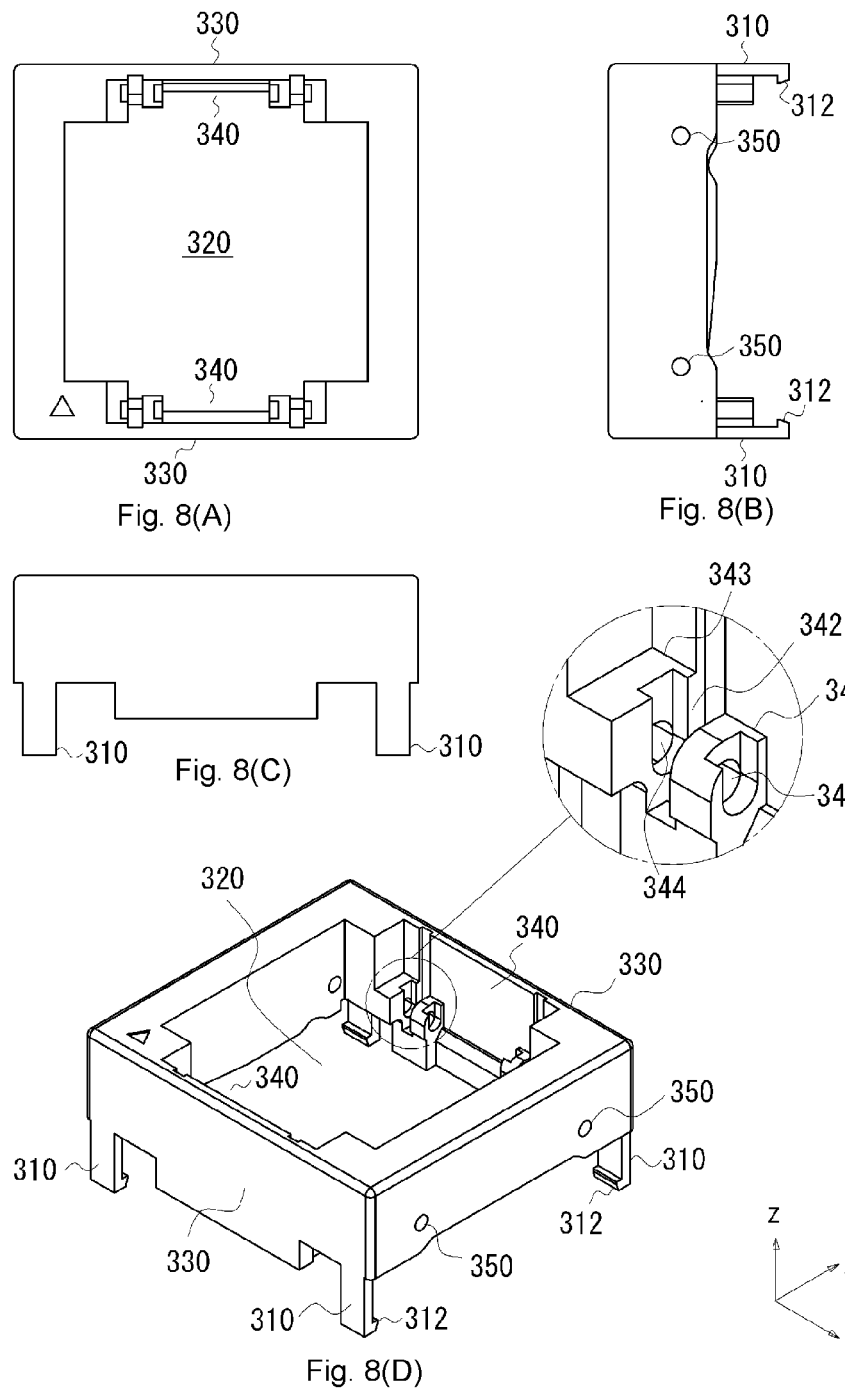

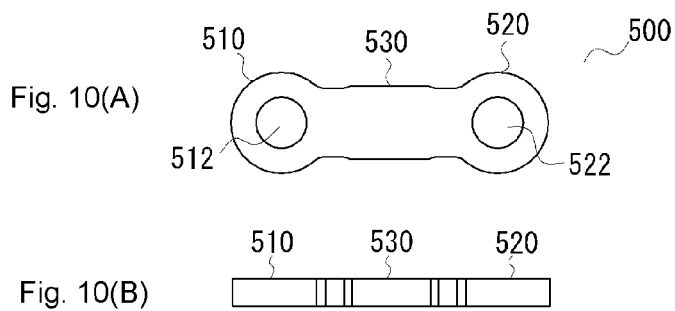
FIG. 10A
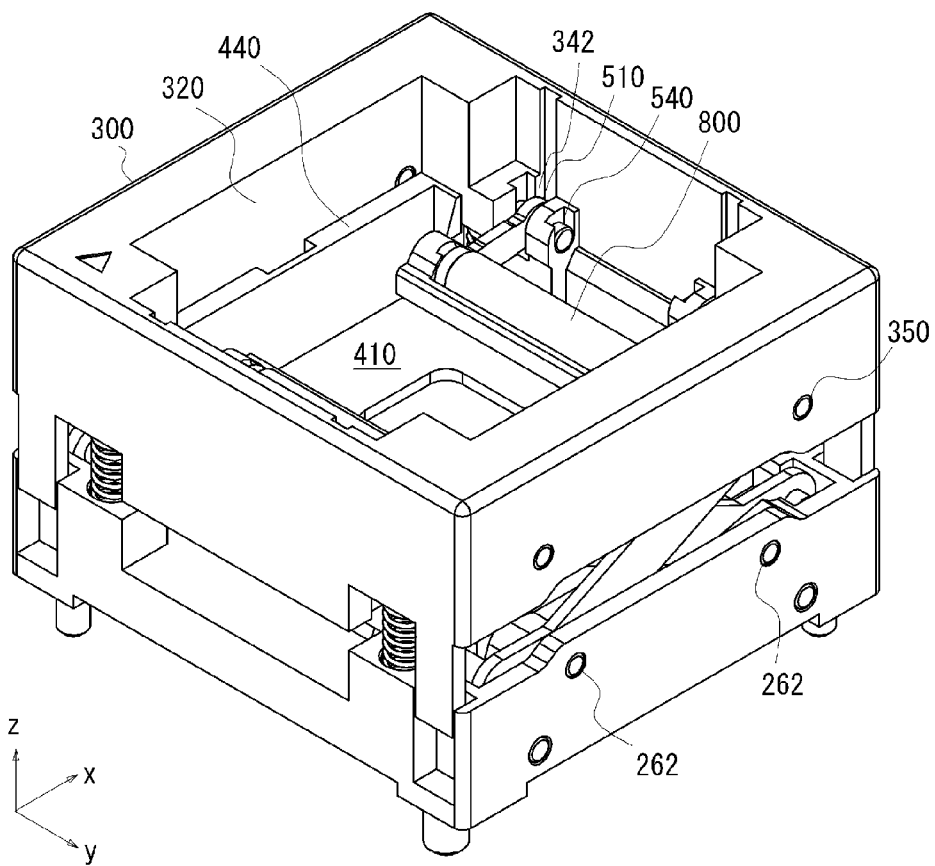

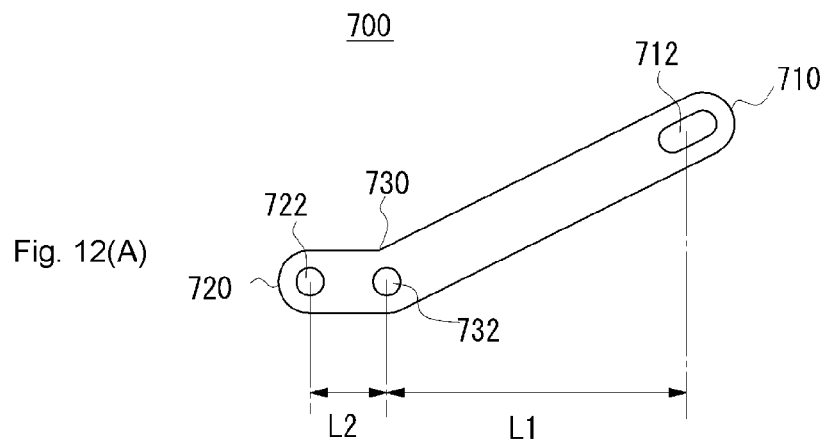
Fig. 12(A)
Fig. 12(B)
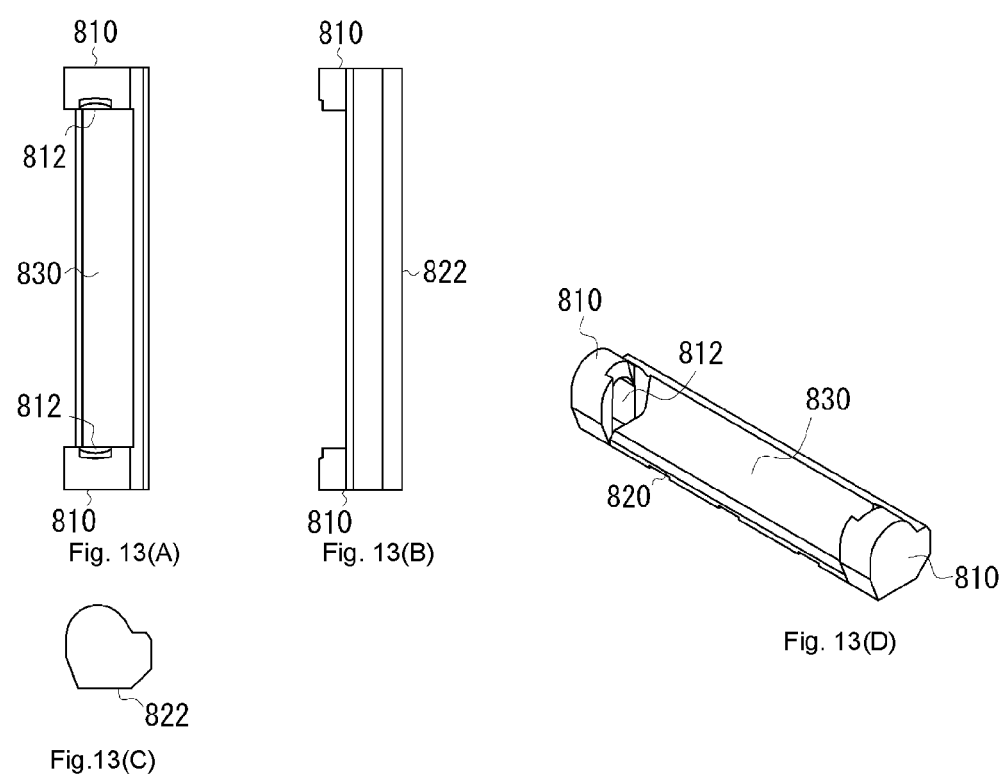
Fig. 13(A)  Fig. 13(B)
Fig. 13(C)
Fig. 13(D)

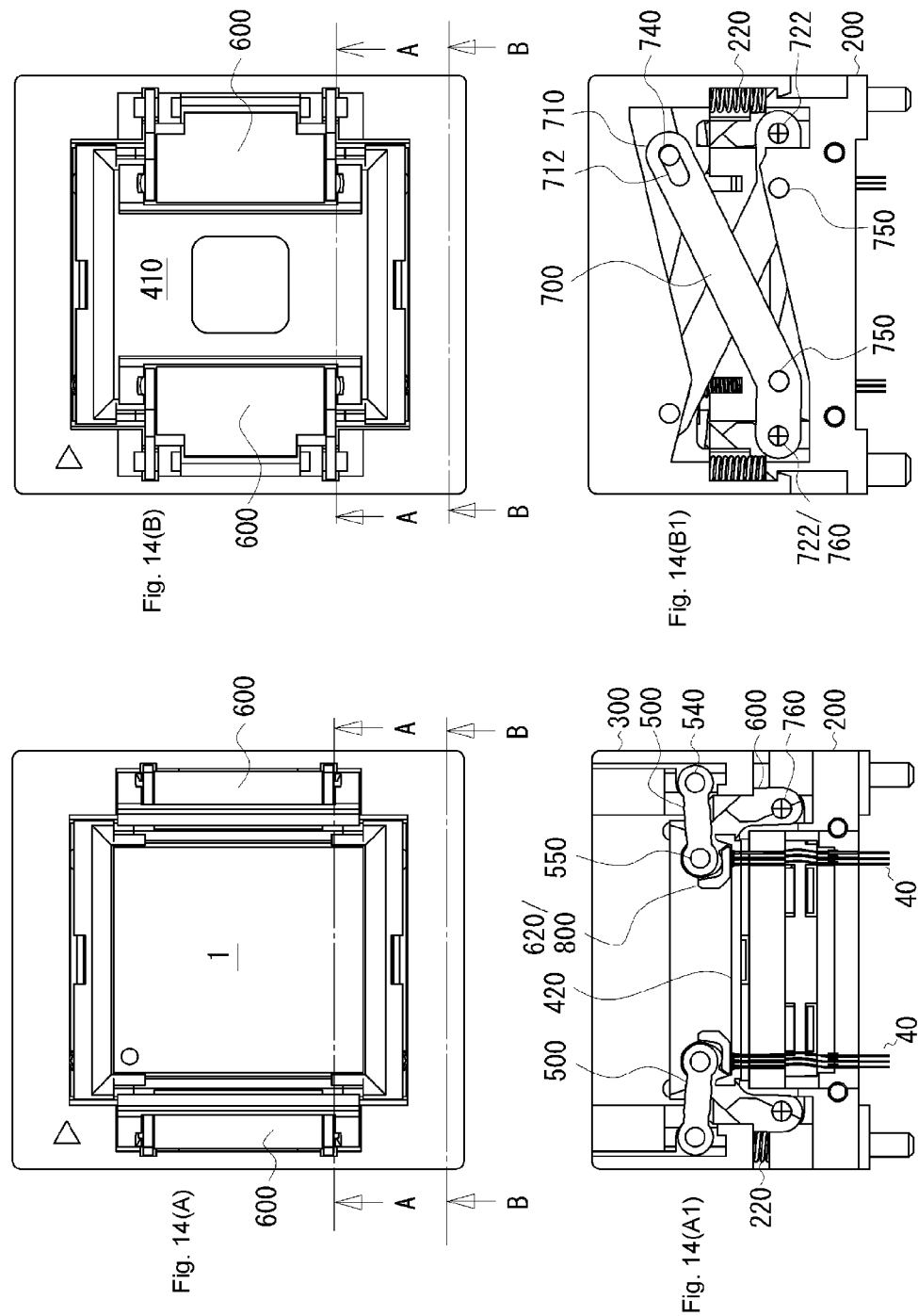

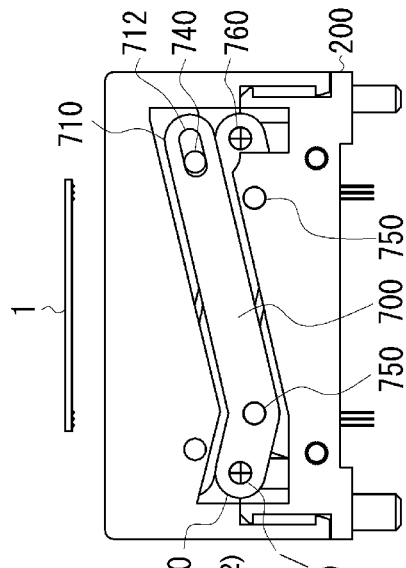
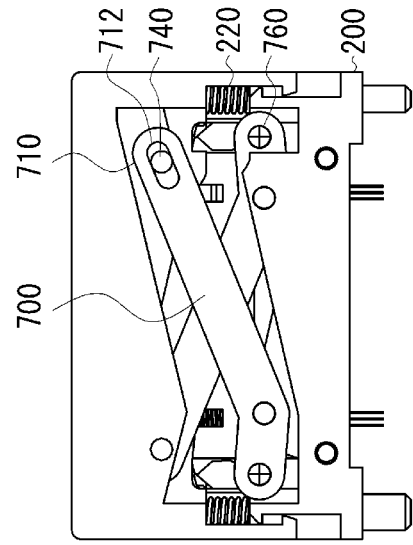
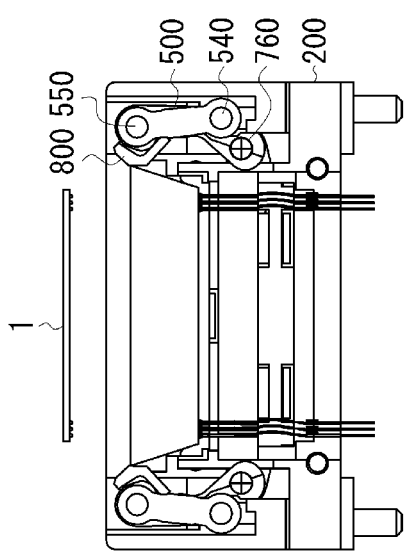
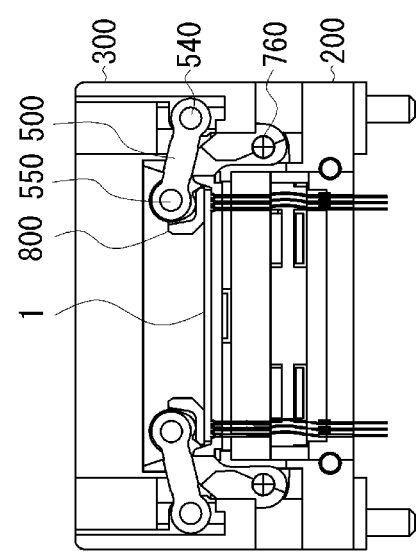

SOCKET FOR REDUCING SIZE AND OPERATING FORCE

FIELD OF THE INVENTION

The present invention relates to sockets, more particularly, a latch mechanism for pressing an electronic device including a semiconductor package such as BGA (Ball Grid Array) and LGA (Land Grid Array) in which terminals are two-dimensionally arranged.

BACKGROUND ART

In a patent document 1 listed below, a socket includes a base member, a cover member, a plurality of contact, an adapter that can move in a direction to be close to or separated from the base portion and provide a mounting surface for BGA, a latch member that is rotatably attached to the base member, and a positioning mechanism that can move in response to the travel of the cover member. A positioning portion of the positioning mechanism can move diagonally over the mounting surface of the adaptor. The positioning mechanism detaches a solder ball from an end of the contact while holding the BGA package so that the BGA package is prevented from jumping up and down on the mounting surface.

In a patent document 2 listed below, a socket includes a base member, a cover member that is reciprocatably attached in a direction to be close to or separated from the base member, a plurality of contacts that is fixed to the base member and mounted on a mounting surface of the base member, and a latch member that is rotatably supported by the base member. A swinging member that is swingable is provided at a tip end of the latch mechanism to press a thin semiconductor. In a patent document 3 listed below, a socket further includes a latch plate at a tip end of a latch mechanism to prevent the tip end of the latch member from contacting directly with the surface of a package.

RELATED ART DOCUMENT

Patent Document

Patent document 1: JP3737078B
Patent document 2: JP2003-168532A
Patent document 3: JP4868413B

SUMMARY OF THE INVENTION

Problem(s) to be Solved

FIGS. 1 to 3 show a socket in a conventional art according to the patent document 3. FIG. 1(a) is a plan view of the conventional socket, FIG. 1(b) is a side view, and FIG. 1(c) is a front vie. FIG. 2 is a sectional view taken along line X-X of FIG. 1(a) and FIG. 3 is a perspective view illustrating the external appearance of the conventional socket.

A socket 10 includes a base member 20, a cover member 30 that can reciprocate in a direction to be close to or separated from the base member 20, and a plurality of contact that are planted in the base member 20. As shown in FIG. 2, contacts 40 that are arranged in a row and a separator 22 that is sheet-shaped and made of insulating material are alternately disposed parallel to a direction of line X-X. The bottom end of the contact 40 is protruded from the bottom surface of the base portion 20 to connect with a conductive contact of a circuit board (not shown) by, for example, soldering. The top end of the contact 40 is electrically connected with a solder ball of the BGA package. An elastically deformable portion (not shown) that is bent in the y-direction is formed between the top and bottom ends of the contact 40 to produce a required contact pressure.

A post 31 extending downwardly is formed at each corner of the cover member 30. The post 31 is inserted into an accommodation hole (not shown). A coil spring 32 is wound around the post 31 so that the cover member 30 is continuously energized in a direction to be separated from the base member 20.

A pair of slots 34 is formed in a side wall 33 that is opposite to the cover 30 and the slot 34 is engaged with a rotational axis 61 of a latch member 60. The slot 34 defines a vertical stroke of the cover member 30. When the rotational axis 61 abuts against the lowermost part of the slot 34, the cover member 30 is in a position farthest from the base member 20. When the rotational axis 61 abuts against the uppermost part of the slot 34, the cover member 30 resists the spring 32 in a position closest to the base member 20 A BGA package is mounted to the adaptor 50 through an opening 35 located substantially in the center of the cover member 30. The adaptor 50 is vertically movably attached to an adaptor mounting surface located in the center of the base member 20 (shown in FIG. 2) to provide a mounting surface 52 for the BGA package.

On the mounting surface 52 of the adaptor 50A, a plurality of through holes is formed in a position corresponding to each contact 40. The top end of the contact 40 extends into the through hole. When the adaptor 50 is in the uppermost position due to the energization of the coil spring, the top end of the contact 40 remains in the through hole without protruding from the mounting surface 52. When the adaptor 50 descends, the top end of the contact 40 protrudes.

As shown in FIG. 2, the latch member 60 is attached to the base member 20 through the rotational axis 61. A link 80 is provided outside of the latch member 60 for rotating the latch member 60. The link 80 rotates in response to the travel of the cover member 30 so that the latch member 60 rotates. The latch member 60 is rotated by the principle of leverage based on the ratio between distances A and B to reduce the operating force of the cover member 30. The larger ratio between the distances A and B increases the outer dimension of the socket in the x-direction.

Furthermore, when the tip end of the latch member 60 presses the BGA package, the surface of the BGA package may be rubbed and scratched due to the rotational travel of the tip end of the latch member 60. A latch plate 70 may be provided to prevent the tip end of the latch member 60 from rubbing the surface of the BGA package. This increases the outer dimension of the socket because a certain space is required for accommodating the latch plate 70.

The present invention is intended to solve the above conventional problems and to reduce the size of a socket with a latch mechanism different from the conventional art. The present invention is also intended to provide a socket which is suitable for finer contact pitch and reduces the operating force.

Means to Solve the Problems

A socket according to the present invention comprises: a base member for holding a plurality of contacts; a cover member movable in a direction to be close to or separated from the base member; a latch member having a pressing portion at a first end thereof, the pressing portion being pressable an electronic device to be pressed; a link member, a first end of the link member connected with the cover member, a second end of the link member connected with the first end of the latch member; and a lever member rotatably fixed to the base member, a first end of the lever member connected with the cover member, a second end of the lever member connected with the second end of the latch member opposed to the first end of the latch member; wherein the link member and the lever member moves the pressing portion of the latch member to an evacuated position when the cover member moves in a direction to be close to the base member, and the link member and the lever member moves the pressing portion of the latch member to a position where the electronic device can be pressed when the cover member moves in a direction to be separated from the base member.

Preferably, the distance from a rotation center to the first end of the lever member is longer than the rotation center to the second end of the lever member. Preferably, the latch member comprises a pair of latch members, and a pair of link members is disposed at the both sides of the pair of latch members. Preferably, the latch member comprises a first surface and a second surface opposite to the first surface, the pressing portion is formed between the first surface and the second surface, a first through hole is formed to penetrate from the first surface to the second surface, the link member is disposed at a first side surface and a second side surface of the latch member respectively, and an axis inserted into the first through hole allows the latch member and the pair of link members to be rotatably connected each other. Preferably, a second through hole is formed at the second end opposite to the pressing portion of the latch member, the lever member is disposed at the first side surface and the second side surface respectively, and an axis inserted into the second through hole allows the latch member and the pair of lever members to be rotatably connected to each other. Preferably, a longitudinal hole is formed at one end of the lever member, and the lever member is connected with the cover member through an axis inserted into the longitudinal hole. Preferably, the angle of the link member is within a range including a horizontal angle when the pressing portion of the latch member presses the electronic device. Preferably, the angle of the link member is the angle that a direction extending from the first end to the second end of the link member intersects with a horizontal direction. Preferably, the link member, the latch member and the lever member are designed such that the pressing portion contacts with the electronic device when the height from the second end of the link member to the rotation center of the lever member is lower than a predetermined range. Preferably, an elastic member is disposed between the cover member and the base member, the elastic member energize the cover member in a direction to be separated from the base member. Preferably, the socket further comprises a latch plate for covering the latch member, the latch plate provided with a flat surface for pressing the electronic device. Preferably, the socket further comprises an adaptor for providing a mounting surface for the electronic device, the adaptor elastically supported, wherein the adaptor descends when the latch member presses the electronic device so that the top end of the contact protrude from the mounting surface.

Advantageous Effect of the Invention

According to the present invention, it provides a socket that is reduced the size and the operating force.

BRIEF DESCRIPTION OF THE DRAWINGS

FIGS. 3(A) and 3(B) are perspective views illustrating an outer appearance of a socket in a conventional art.

FIG. 4 (A) is a plan view, FIG. 4 (B) is a side view, FIG. 4 (C) is a front view, and FIG. 4 (D) is a perspective view.

FIG. 5 (A) is a plan view, FIGS. 5 (B) and 5(D) are side views, FIG. 5 (C) is a front view, and FIG. 5 (E) is a perspective view.

FIG. 7 (A) is a plan view, FIG. 7 (B) is a side view, FIG. 7 (B) is a front view and FIG. 7 (D) is a perspective view.

FIGS. 8(A) to 8(D) are a cover member of a socket according to one embodiment of the present invention. FIG. 8 (A) is a plan view, FIG. 8 (B) is a side view, FIG. 8 (C) is a front view and FIG. 8 (D) is a perspective view.

FIG. 9 (A) is a plan view, FIG. 9 (B) is a side view, FIG. 9 (C) is a front view and FIG. 9 (D) is a perspective view.

FIGS. 10(A) to 10(B) are a link member of a socket according to one embodiment of the present invention. FIG. 10 (A) is a plan view and FIG. 10 (B) is a side view.

FIG. 10A is an enlarged perspective view according to one embodiment of the present invention.

FIG. 11 (A) is a plan view, FIG. 11 (B) is a side view, FIG. 11 (C) is a front view and FIG. 11 (D) is a perspective view.

FIGS. 12(A) to 12(B) are a lever member of a socket according to one embodiment of the present invention. FIG. 12 (A) is a plan view and FIG. 12 (B) is a side view.

FIGS. 13(A) to 13(D) are a latch plate of a socket according to one embodiment of the present invention. FIG. 13 (A) is a plan view, FIG. 13 (B) is a side view, FIG. 13 (C) is a front view and FIG. 13 (D) is a perspective view.

FIGS. 14(A), 14(A1), 14(B) and 14(B1) depict sectional views illustrating an operation of a socket according to one embodiment of the present invention.

FIGS. 15(A2), 15(A3), 15(B2) and 15(B3) are sectional views illustrating an operation of a socket according to one embodiment of the present invention.

MODE FOR CARRYING OUT THE INVENTION

Embodiments according to the present invention will be described in detail below with reference to the accompanying drawings. The present invention is used for a socket that may mount an electronic device including a semiconductor package such as BGA, LGA, QFP or other electronic components. In a preferred embodiment, the socket is attached to a circuit substrate and provides an electrical interface between an electronic device mounted thereon and the circuit board. The socket may be used for burn-in test.

[Embodiment]

Figures 4A, 4B:
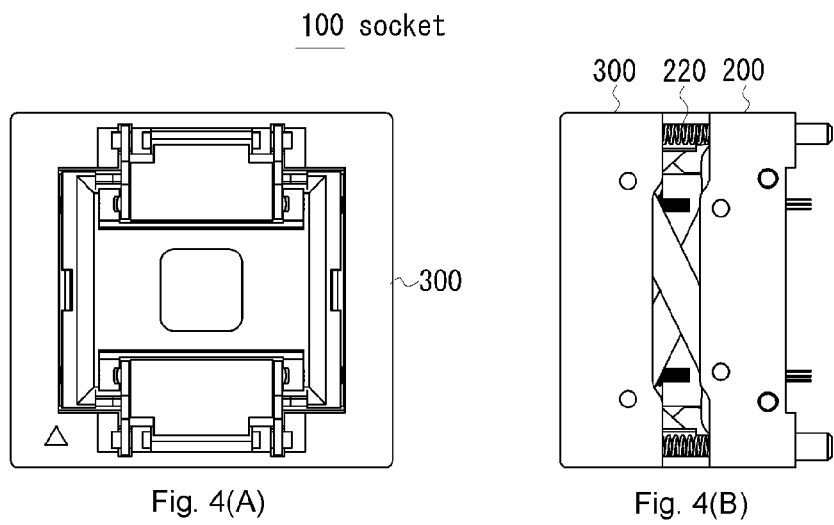
FIGS. 4(A) to 4(D) illustrate a socket according to one embodiment of the present invention, with a cover member upwardly energized.
Figures 4C, 4D:
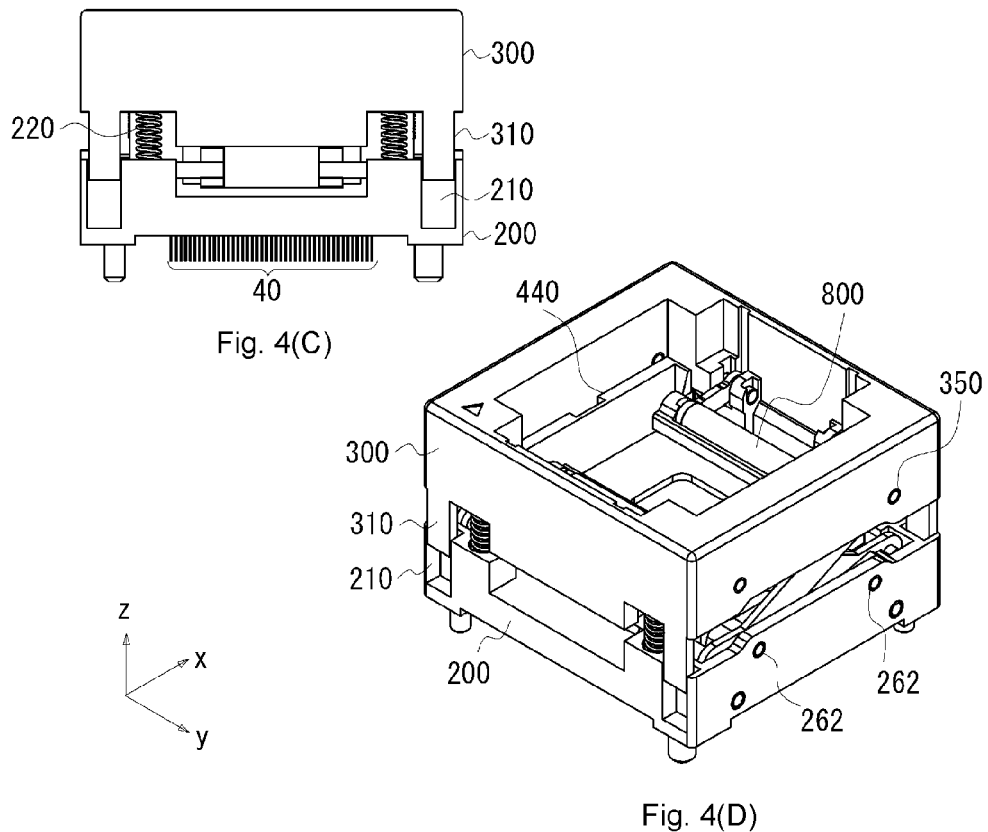
Figure 5A:
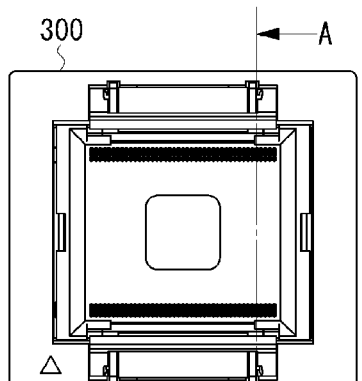
FIGS. 5(A) to 5(E) illustrate a socket according to one embodiment of the present invention, with a cover member downwardly moved.
Figure 5B:
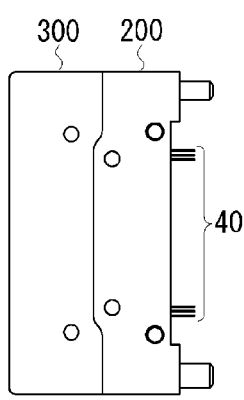
Figure 5C:
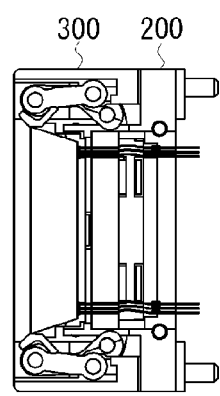
Figure 5D:
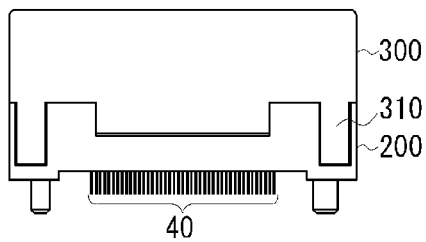
Figure 5E:
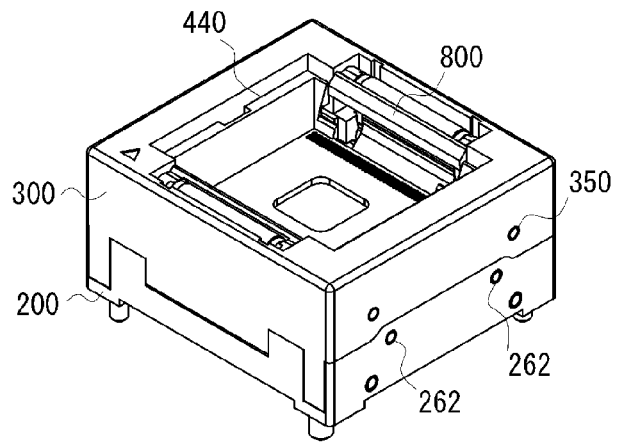
Figure 6:
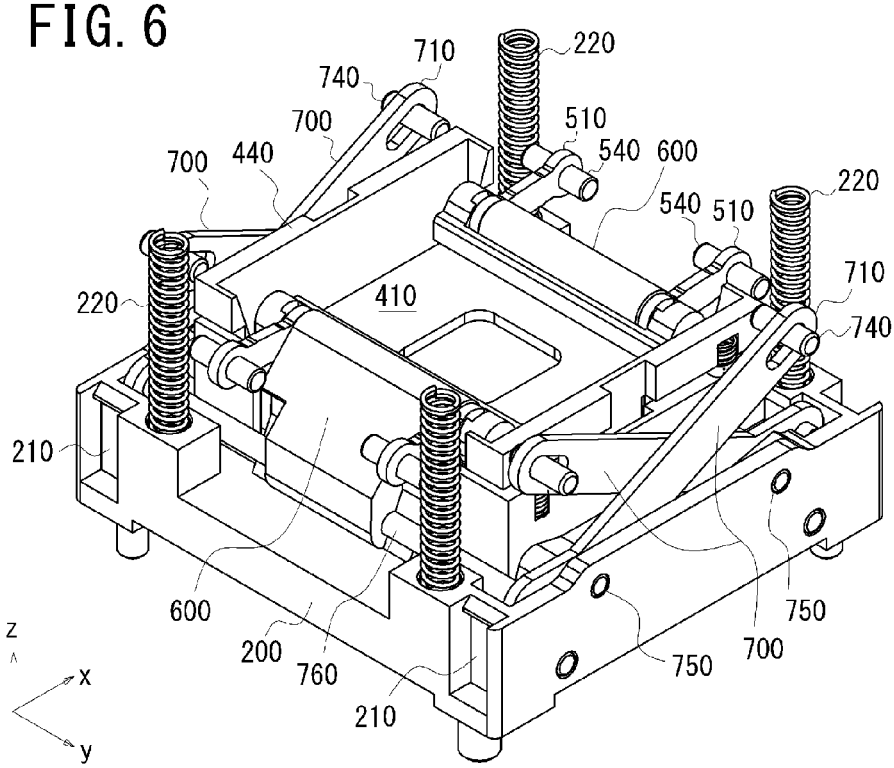
FIG. 6 is a perspective view of a socket according to one embodiment of the present invention, with the cover member removed.

FIGS. 4 to 6 show a socket according to one embodiment of the present invention. FIG. 4 shows the cover member is energized upwardly. FIG. 5 shows the cover member is moved toward the base member. FIG. 6 shows the cover is removed.

A socket according to the present invention comprises a base member 200, a cover member 300 that can reciprocate in a direction to be close to or separated from the base member 200, and a plurality of contacts 40 that are planted into the base member 200. The base member 200 and the cover member 300 are formed by injection molding, for example, highly heat resistant polyether sulfone (PES) resin. Other than resistant polyether sulfone (PES) resin, polyphenylene sulfide (PPS) resin, a liquid crystal polymer (LCP), polysulfone (PSF) resin, polyalylate (PAR) resin, or highly heat resistant polyether-imide (PEI) resin may be used.

Figure 1A:
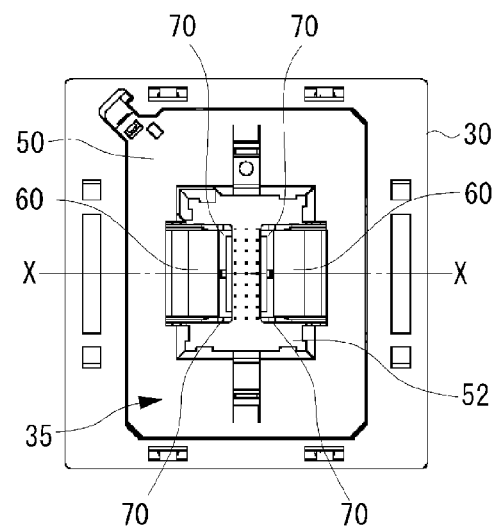
FIG. 1 (A) is a plan view of a socket in a conventional art, FIG. 1 (B) is a side view
FIG. 1(C) is a front view.
Figure 1B:
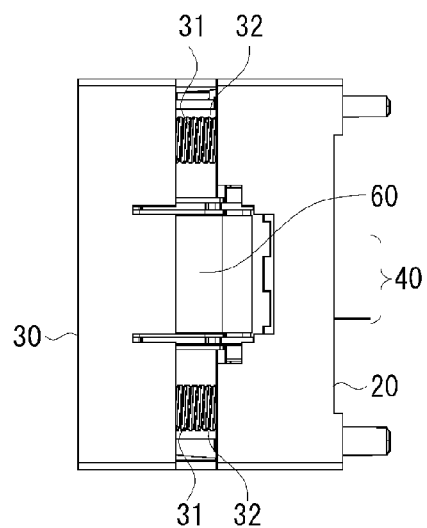
Figure 1C:
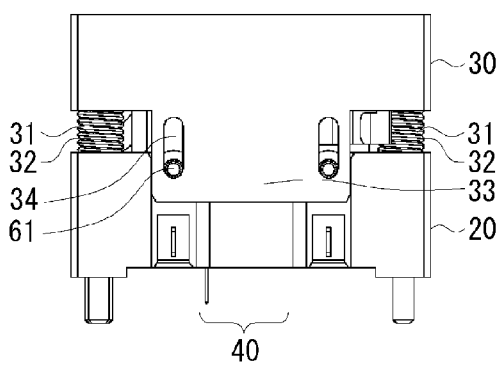
Figure 2:
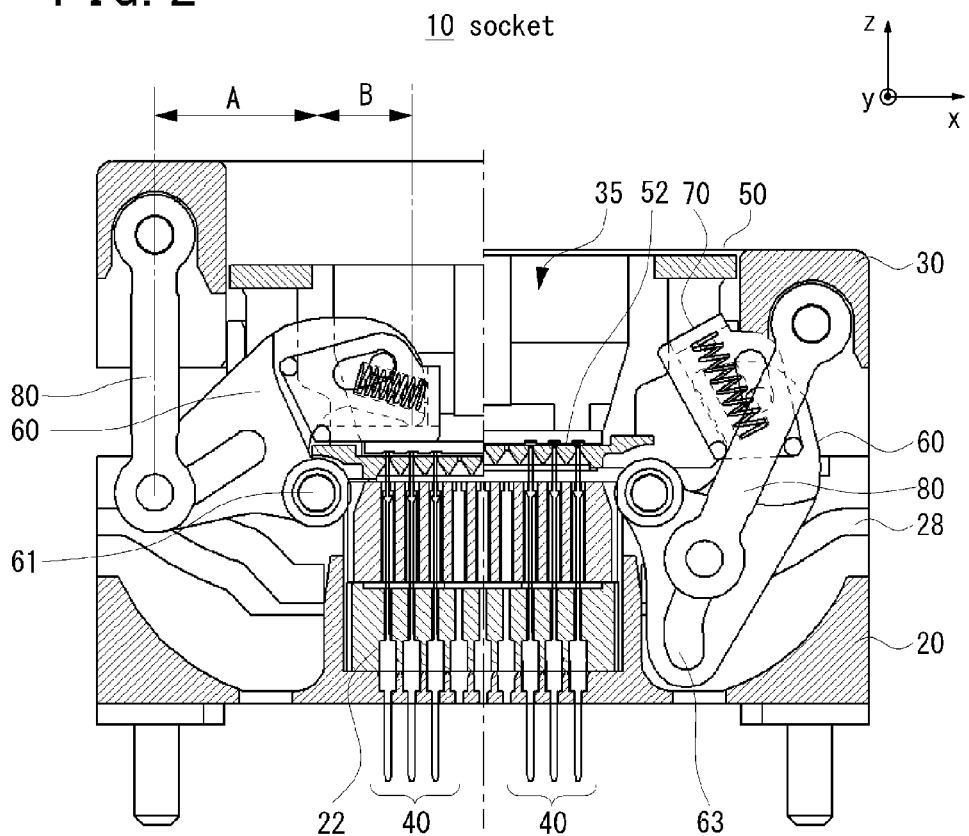
FIG. 2 is a sectional view taken along line X-X of FIG. 1 (A), with the cover unloaded and full-stroked when mounted a semiconductor device.

While the contact 40 will not be illustrated in detail herein, the contact 40 is configured in a shape that is suitable for a terminal of a semiconductor package to be mounted. For example, when a semiconductor package is BGA, the contact 40 may have the same configuration as a contact in the conventional art that is shown in FIG. 2. Preferably, the contact 40 includes a top end, a bottom end and an elastically deformable portion that is bent in the z-direction between the top end and the bottom end. Each contact 40 is laminated through a sheeted insulating separator so that a contact unit that is positioned in the x-direction and y-direction is formed. The contact unit is accommodated from the bottom side of the base member to the inside and then secured with, for example, a shaft. At this time, the underside of the contact unit matches with the bottom surface of the base member 200, while the lower end of the contact protrudes therefrom. This configuration of the contact unit is an example and not limited thereto. For example, instead of using separator, a plurality of contacts may be supported such that they are sandwiched by, for example, using an upper and lower moldings.

An engaging groove 210 for engaging with a hook 310 of the cover member 300 is provided at the side wall adjacent to each corner of the base member 200. A holding groove 250 (see FIG. 7) is provided in a position next to the engaging groove 210 and a coil sprig 220 as an elastic member for energizing the cover member 300 is attached therein. Thus, the cover member 300 is continuously energized in a direction to be separated from the base member 200. When the hook 310 engages with the engaging groove 210, the travel of the cover member 300 is guided, while the stroke distance of the cover member 300 is regulated. That is, when the cover member 300 is separated from the base member 200 by a certain distance, the hook 310 is locked together with the top end of the engaging groove 210 so that the upward travel of the cover member 300 is regulated (see FIG. 4). When the hook 310 abuts against the bottom end of the engaging groove 210, the downward travel of the cover member 300 is regulated (see FIG. 5). The stroke distance of the cover member may be regulated by other means.

The base member 200 and the cover member 300 are shown in FIGS. 7 and 8, respectively. The base member 200 is generally rectangular-shaped. An opening 230 that is generally rectangular-shaped is formed at the central portion of the base member 200, into which the contact unit is inserted from the bottom side of the base member 200. A groove 242 is provided in the z-direction in a pair of opposed side walls defining the opening 230 for regulating the travel of an adaptor 400 described below. A holding groove 250 is formed adjacent to the corner of the base member 200 for accommodating the coil spring 220. A lever member configuring a latch mechanism is accommodated into a space 270 between the side surface 260 opposed to the base member 200 and the side wall 240.

As shown in FIG. 8, the cover member 300 is generally rectangular-shaped and an opening 320 is formed therein for inserting or removing a semiconductor package. A link member configuring the latch mechanism is accommodated to a space 340 inside the side surface 330 opposed to the cover member 300. A pair of side walls 343 is provided in the space 340 for forming a slit 342 that accommodates the end of the latch member, while a groove 344 is formed in the pair of side walls 343. As discussed below, a link member 500 in the slit 342 is rotatably supported by the axis inserted into the groove 344. A support hole 350 is formed in the opposed side wall of the cover member in the y-direction for supporting an axis 740 that engages with a lever member 700 (see FIG. 6). A claw 312 engaging with an engaging groove 210 in the base member 200 is formed at the top end of the hook 310 that extends downwardly from the corner part of the cover member 300.

Figures 9A, 9B:
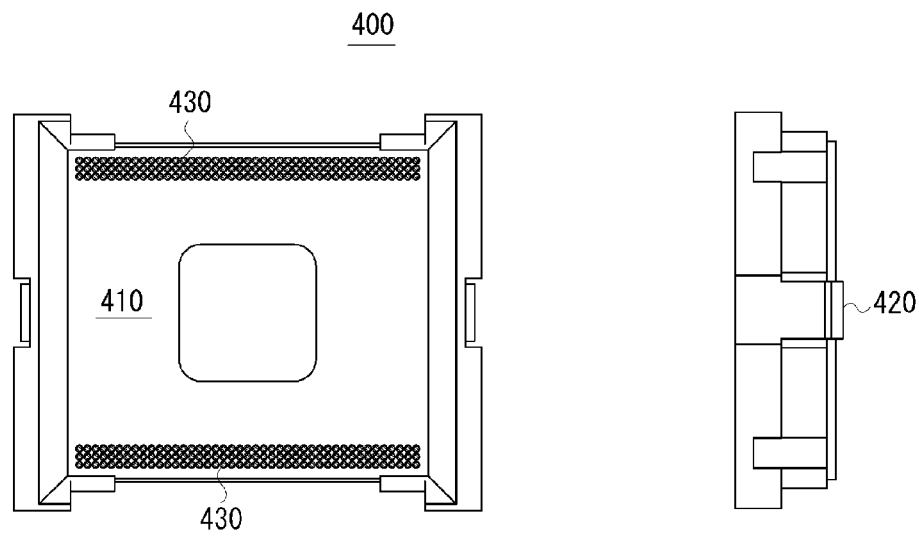
FIGS. 9(A) to 9(D) are an adaptor of a socket according to one embodiment of the present invention.
Figure 9C:
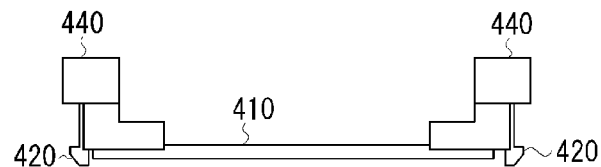
Figure 9D:
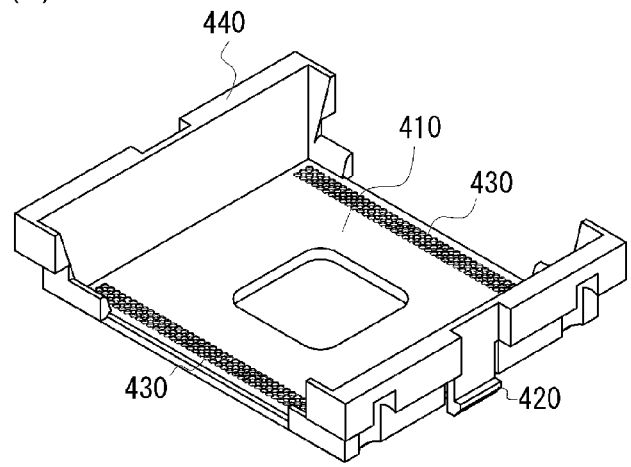
Figure 11A:
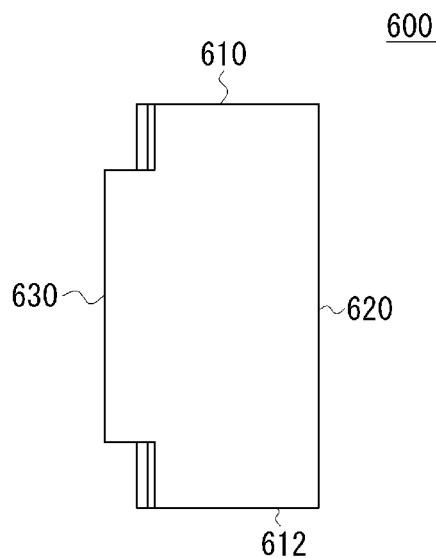
FIGS. 11(A) to 11(D) are a latch member of a socket according to one embodiment of the present invention.
Figure 11B:
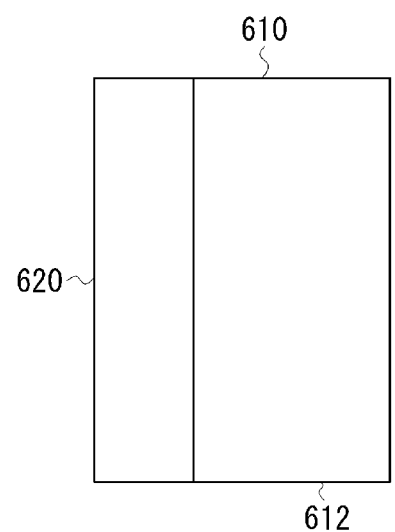
Figure 11C:
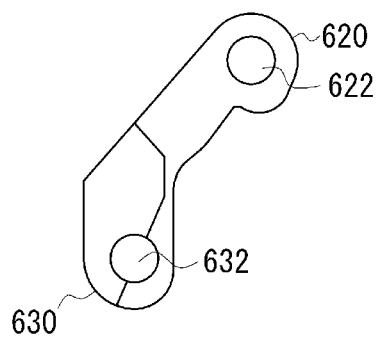
Figure 11D:
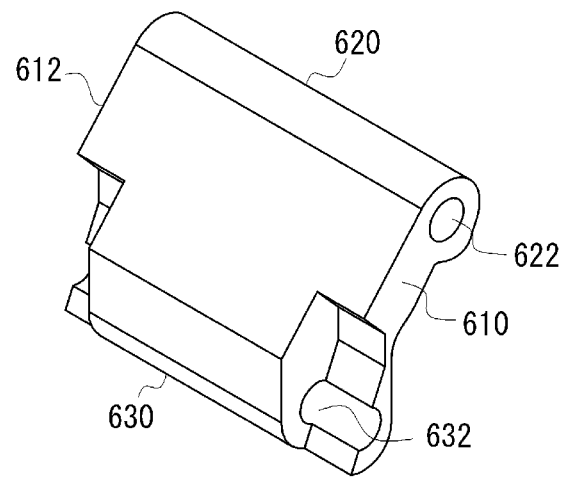

An adaptor is shown in FIG. 9. The adaptor 400 is generally rectangular-shaped and vertically movably attached between the pair of opposed side walls 240 of the base member 200. A mounting surface 410 is formed in the adaptor 400 for mounting a semiconductor package. A pair of hooks 420 extending downwardly is formed at the both ends of the mounting surface 410. The hook 420 engages slidably with the groove 242 that is formed in the side wall 240 of the base member 200. The adaptor 400 is continuously energized by the coil spring (not shown) in a direction to be separated from the base member 200. The hook 420 engages with the top end of the groove 242 to prevent the detachment of the adaptor 400. When the force that is larger than the coil spring 400 is applied to the adaptor 400, the adaptor 400 moves down along the groove 242 against the coil spring.

In a mounting surface 410, a plurality of through holes 430 is formed in positions corresponding to each contact 40, while the top end of the contact 40 extends into the through hole 430. It should be noted that a pattern of the through hole 430 as shown also corresponds to a pattern of terminals of a semiconductor package to be mounted. When the adaptor 400 is at the uppermost position due to the energization of the coil spring, the top end of the contact 40 remains in the through hole 420 without protruding from the mounting surface 410. When the adaptor 400 moves down, the top end of the contact protrudes from the mounting surface 410. A guide portion 440 that extends vertically and includes an inclined surface is formed at opposed sides of the adaptor 400. The guide portion 440 defines along the inclined surface a semiconductor package that is inserted from the opening 320 of the cover member 300 and then guides the semiconductor package to the mounting surface 410.

A positioning mechanism (not shown) may be built into the corner of the adaptor 400. The positioning mechanism is provided with a pressing member that moves in a diagonal direction of the mounting surface 410 in response to the reciprocation of the cover member 300. The pressing portion presses the semiconductor package in the diagonal direction so that the semiconductor package may be positioned. The adaptor 400 may be removed or replaced from the base member 200 according to the size or type of a semiconductor package to be mounted.

Now, a latch mechanism according to one embodiment of the present invention will be described. The latch mechanism according to the embodiment comprises a link member 500, a latch member 600 and a lever member 700. In a preferred embodiment, the latch mechanism comprises a latch plate 800. The latch mechanism according to the embodiment operates a pair of latch member 600 using link member 500 and the lever member 700 according to the position of the cover member 300.

The link member 500 is shown in FIG. 10. The link member 500 is used for connecting the cover member 300 and the latch member 600. The link member 500 comprises a first end 510 as one end, a second end 520 as other end and a connecting portion 530 for connecting the first end 510 and the second end 520. The first end 510 is generally circular-shaped and a through hole 512 that is circular-shaped is formed therein. The second end 520 is also generally circular-shaped and a through hole 522 that is circular-shaped is formed therein.

FIG. 10A is an enlarged perspective view of a socket. As shown in FIG. 8 and FIG. 10A, a slit 342 is formed in a space 340 of the cover member 300, to which the first end 510 of the link member 500 is inserted. Preferably, the slit 342 extends at a certain depth in the z-direction. The width of the y-direction is slightly larger than the thickness of the link member 500. A groove 344 is formed in the y-direction of the opposite side walls 343 over the slit 342. The first end 510 of the link member 500 is inserted into the slit 342, while the rotational axis 540 is inserted into the through hole 512 of the link member 500 and the groove 344. Thus, the first end 510 of the link member 500 is rotatably attached to the cover member 300. The second end 520 of the link member 500 is rotatably attached to the latch member 600 as described below.

A latch member is shown in FIG. 11. The latch member 600 comprises opposed side surfaces 610, 612, and a pressing portion 620 having an arc-shaped surface between the side surfaces 610, 612. A through hole 622 that is circular-shaped and extends to the side surfaces 610, 612 is formed in the pressing portion 620. A pair of link members 500 is disposed at the both side surfaces of the pressing portion 620, while a rotational axis 550 (shown in FIG. 14) is inserted into the second end 520 of the link member 500 and the through hole 622 of the pressing portion 620. Thus, the second end 520 of the link member 500 and the pressing portion 620 are rotatably connected.

A narrow portion 630 at the side opposite to the pressing portion 620 of the latch member 600 is formed by means of cutting away each portion of both sides. The narrow portion 630 comprises an arc-shaped surface. The narrow portion 630 is formed with a through hole 632 that extends to the side surfaces 610, 612. A lever member 700 is rotatably attached to the narrow portion 630 as described below.

A lever member is shown in FIG. 12. The lever member 700 that uses the principle of leverage including a point of fulcrum, a point of effort and a point of load transfers operating force applied to the cover member 300 to the latch member 600. The lever member 700 comprises a first extending portion 710 functioning as a point of effort and a second extending portion 720 functioning as a point of load. The first extending portion 710 inclines at a predetermined angle and extends from the second extending portion 720. A longitudinal hole 712 is formed at the end of the first extending portion 710, while an axis 740 as shown in FIG. 6 is inserted into the longitudinal hole 712. Thus, the first extending portion 710 is rotatably and slidably connected to the cover member via the axis 740. A through hole 722 that is circular-shaped is formed at the end of the second extending portion 720. The second extending portion 720 is rotatably connected with the narrow portion 630 of the latch member 600. A through hole 732 functioning as a fulcrum is formed at a crossing portion 730 between the first extending portion 710 and the second extending portion 720. The crossing portion 730 is rotatably secured to the base member 200. The length L1 from the crossing portion 730 to the long hole 712 is configured to be longer than the length L2 from the crossing portion 730 to the through hole 722 so that the force acting on the first extending portion 710 is increased in the second extending portion 720 at the ratio of L1/L2.

Figure 7A:
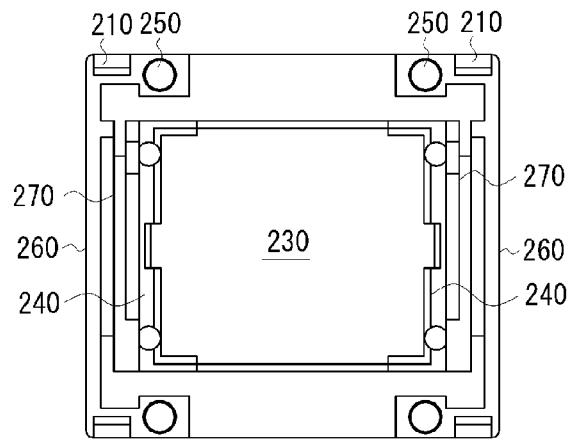
FIGS. 7(A) to 7(D) are a base member of a socket according to one embodiment of the present invention.
Figure 7B:
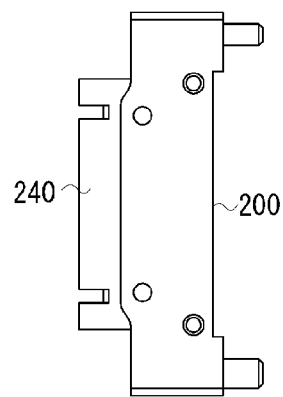
Figure 7C:
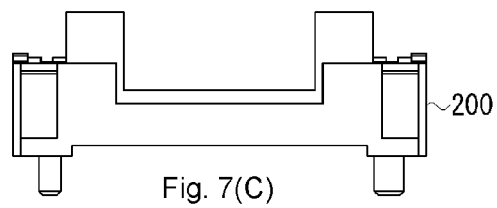
Figure 7D:
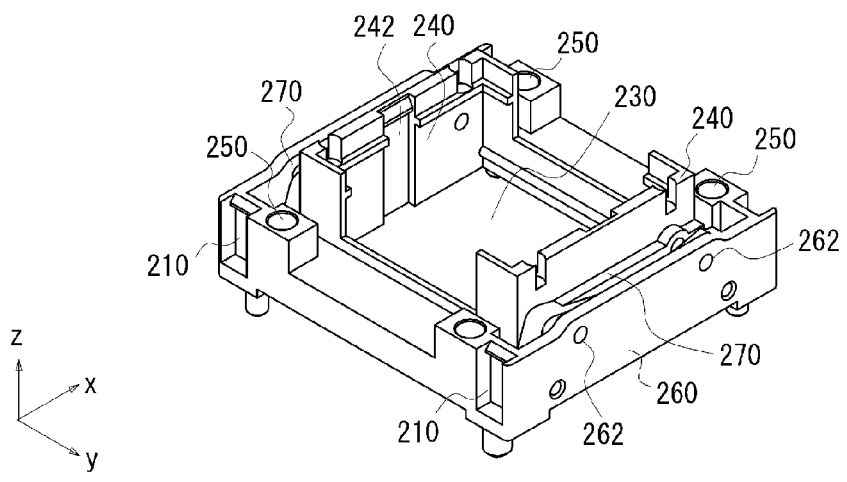

As shown in FIGS. 4, 5 and 6, the pair of latch members 600 is disposed above the base member 200 in the x-direction. The pair of lever member 700 is respectively disposed at the opposite sides in the y-direction of the pair of latch member 600. The pair of lever members 700 is disposed such that the lever members are crossed. The axis 740 is inserted into the long hole 712 of the first extending portion 710. The axis 740 is secured in the support hole 350 that is formed in the side of the cover member 300 as shown in FIGS. 8(B) and 8(D). The axis 750 inserted into the through hole 732 of the crossing portion 730 is secured in the support hole 262 that is formed in the side surface 260 of the base member 200 as shown in FIGS. 7(B) and 7(D). The second extending portion 720 is disposed at the both ends of the narrow portion 630 of the latch member 600 shown in FIG. 11(D). The axis 760 is inserted into the through hole 722 of the second extending portion 720 and the through hole 632 of the narrow portion 630 (see FIG. 14) so that the latch member 600 and the lever member 700 are rotatably connected to each other.

A latch plate is shown in FIG. 13. The latch plate 800 comprises a pair of side walls 810 and a connection portion 820 connected between the pair of side walls 810. The pair of side walls 810 and the connection portion 820 forms a space 830 that is cylindrical-shaped and partly opened, to which the pressing portion 620 of the latch member 600 and the second end 520 of the link member 500 are accommodated. As described above, the pair of link members 500 is disposed at the both sides of the pressing portion 620, while both link members are connected to each other with the rotational axis 540. The end of the rotational axis 540 extends to the outside of the link member 500 to be supported in the groove 812 of the side wall 810 of the latch plate 800. Thus, the latch plate 800 is rotatably attached to the pressing portion 620. The connection portion 820 of the latch plate 800 comprises a flat bottom surface 822 for pressing a front surface of a semiconductor package.

Figure 16:
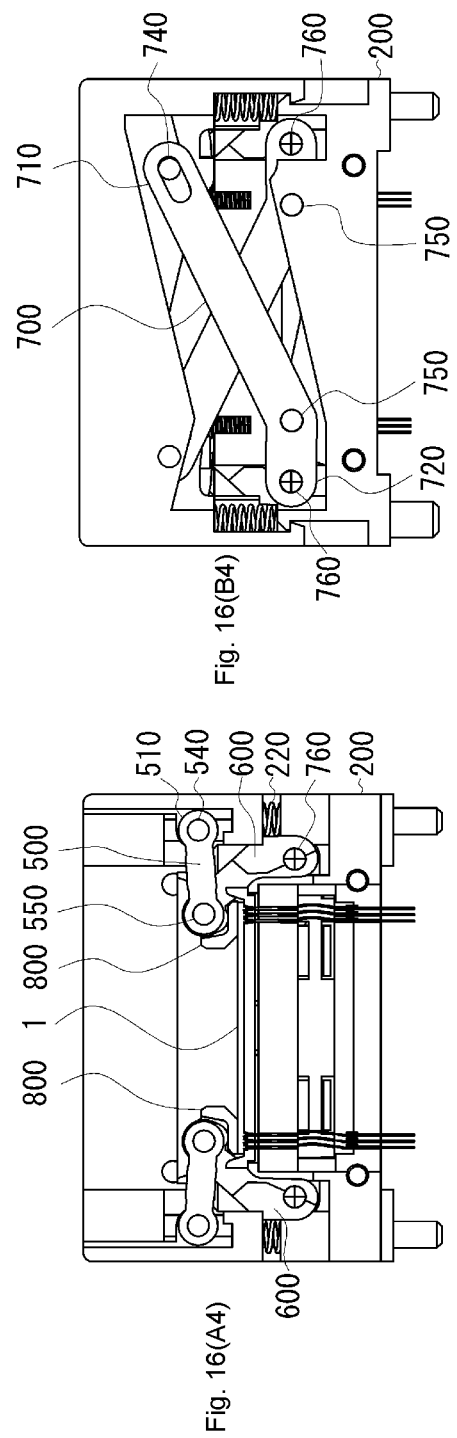
FIGS. 16(A4) and 16(B4) are sectional views illustrating an operation of a socket according to one embodiment of the present invention.

Now, a socket operation according to one embodiment of the present invention will be described with reference to FIGS. 14 to 16. FIG. 14(A) is a plan view in which the latch member moves to an evacuated position due to the decent of the cover member 300 and the BGA package is mounted on the mounting surface. FIG. 14(B) is a plan view in which the cover member is positioned upwardly and the pressing portion of the latch member is positioned at a position to be pressed. (A1) to (A4) in FIGS. 14 to 16 are sectional views taken along line A-A, while (B1) to (B4) are sectional views taken along line B-B.

As shown in FIGS. 14(A1) and 14(B1), the cover member 300 is positioned at the uppermost position apart from the base member 200 due to the energization of the coil spring 200. At this time, the claw 312 of the hook 310 of the cover member 300 is engaged with the engaging groove 210. When the cover member 300 is positioned at the uppermost position, the link member 500 is generally in a horizontal position, while the pressing portion 620 of the latch member 600 that is connected to the second end 520 of the link member 500, and the latch plate 800 are mounted on the mounting surface 410. The first extending portion 710 of the lever plate 700 is raised upwardly by the cover member 300, while the second end portion 720 is in a position to which the narrow portion 630 of the latch member 600 corresponds.

As shown in FIGS. 15(A2) and 15(B2), the cover member 300 moves to the base member 200. In response to the descent of the cover member 300, the first end 510 of the link member 500 connected with the cover member 300 moves downwardly so that the pressing portion 620 of the latch member 600 moves apart from the mounting surface 410. The travel of the cover member 300 causes the first extending portion 710 of the lever member 700 to rotate downwardly around the fulcrum 732 and the second extending portion 720 to rotate upwardly. That is, the operating force acting on the first extending portion 710 applies to the second extending portion 720 due to the principle of leverage so that the narrow portion 630 of the latch member 600 coupled to the second extending portion 720 is elevated.

When the hook 310 of the cover member 300 abuts against the engaging groove 210 of the base member 200, the cover member 300 is at the lowermost position. FIGS. 15(A2) and 15(B2) show this aspect. The link member 500 moves to extend generally vertical. The travel of the link member 500 causes the pressing portion 620 of the latch member 600 to move apart from the mounting surface 410 to evacuate completely from the mounting surface 410. The second extending portion 720 of the lever member 700 moves to the uppermost position. The travel of the second extending portion 720 causes the narrow portion 630 of the latch member 600 to be elevated.

In this condition, the BGA package 1 is mounted from the opening 320 of the cover member 300 to the mounting surface 410. The BGA package 1 is guided by the guiding portion 430 to be positioned on the mounting surface 410 and mounted thereon. At this time, the top end of the contact 40 does not protrude from the front surface of the mounting surface 410.

When the operating force toward the cover member 300 is released, the cover member 300 is elevated due to the elastic force of the coil spring 220. The elevation of the cover member 300 causes the first end 510 of the link member 500 to be elevated so that the pressing portion 620 of the latch member 600 connected to the second end 520 of the cover member 300 moves toward the mounting portion 410. On the other hand, the first extending portion 710 of the lever member 700 rotates upwardly, the second extending portion 720 rotates downwardly, and the narrow portion 630 of the latch member 600 moves downwardly.

When the cover member 300 elevates, the pressing portion 620 of the latch member 600 moves to the mounting portion 410 as shown in FIGS. 15(A3) and 15(B3) so that the latch plate 800 contacts to the BGA package 1. When the cover member 300 further elevates, the latch member 600 rotates due to the rotation of the link member 500 so that the pressing portion 620 presses down the BGA package 1 and the adaptor 400 via the latch plate 800. Thus, the top end of the contact 40 protrudes from the through hole of the mounting surface 410 and touches the solder ball. In the end, the BGA package 1 is pushed down to a predetermined position or a position where a balance between the spring force pushing the cover member 300 up and the contact force of the contact 40 is achieved. This aspect is shown in FIGS. 16(A4) and 16(B4). At this time, the link member is generally in a horizontal position. The reaction force from the BGA package 1 that acts in the axial direction of the link member 500 applies to the axis 540 generally in a vertical direction. That is, the torque of the axis 540 is minimized so that the rotation of the axis 540 of the link member 500 is restricted.

The BGA package is subjected to burn-in test in the condition shown in FIG. 16. For removing the BGA package from a socket after burn-in test etc., the cover member 300 is moved downwardly again. The first end 510 of the link member 500 moves downwardly and the second end 520 of the link member 500 restricts the travel of the pressing portion 620 to a direction apart from the mounting portion, while the narrow portion 630 of the latch member 600 is pushed up by the second extending portion 720 of the lever member 700. The travel of the pressing portion 620 causes the adaptor 400 to be elevated so that the top end of the contact relatively moves from the front surface of the mounting surface into the through hole, thereby releasing the electrical connection between the electrical contact and the BGA package. When the cover member 300 is full-stroked, the latch member 600 moves completely to the retractable position to remove the BGA package 1 from the socket.

Figure 17:
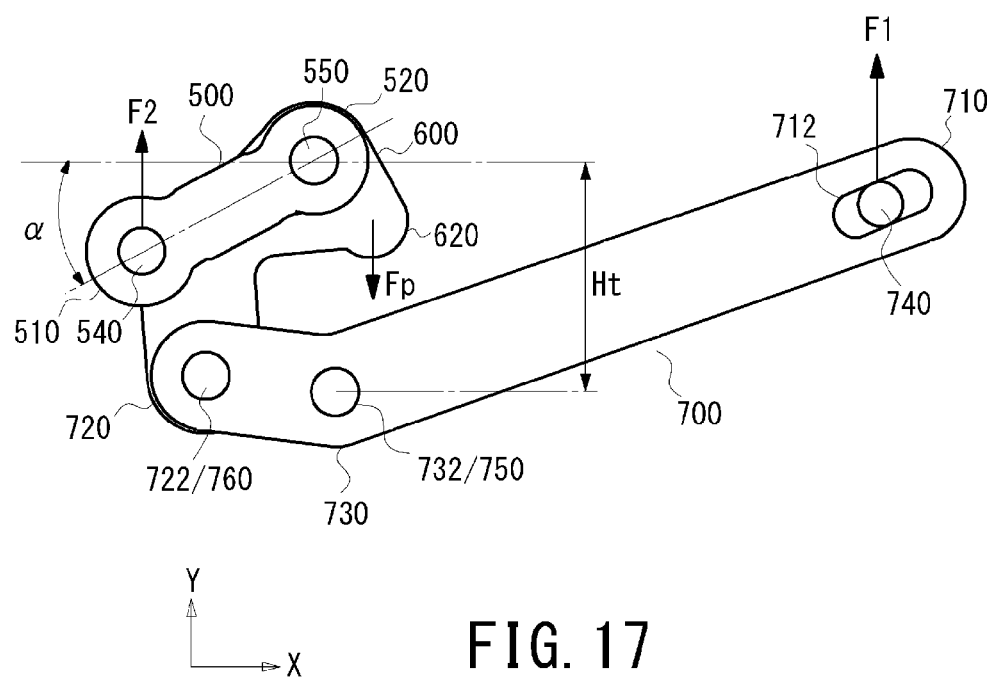
FIG. 17 is a diagram illustrating a connection relation of a latch mechanism according to one embodiment of the present invention.
Figure 18A:
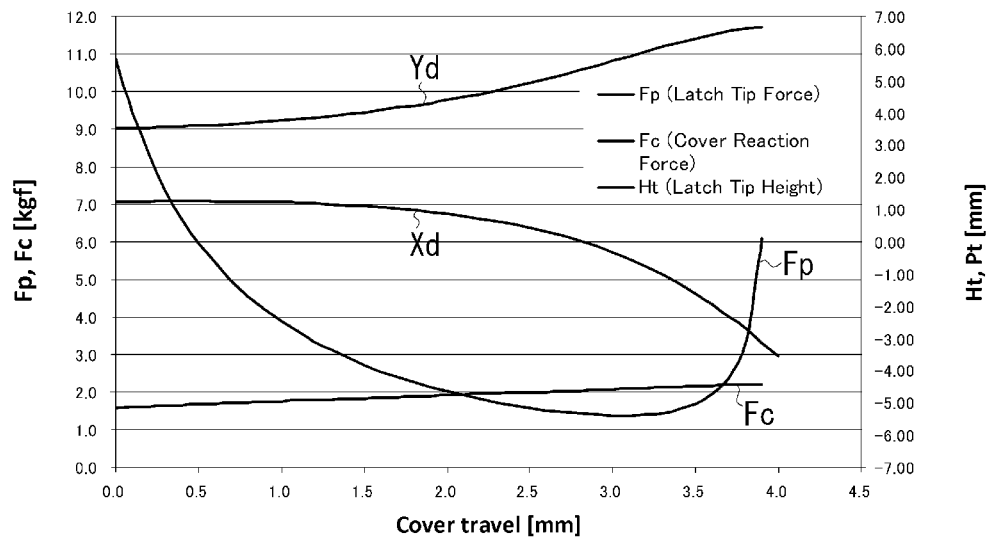
FIGS. 18(A) to 18(B) are a graph indicating operations of each portion of a latch mechanism according to one embodiment of the present invention.
Figure 18B:
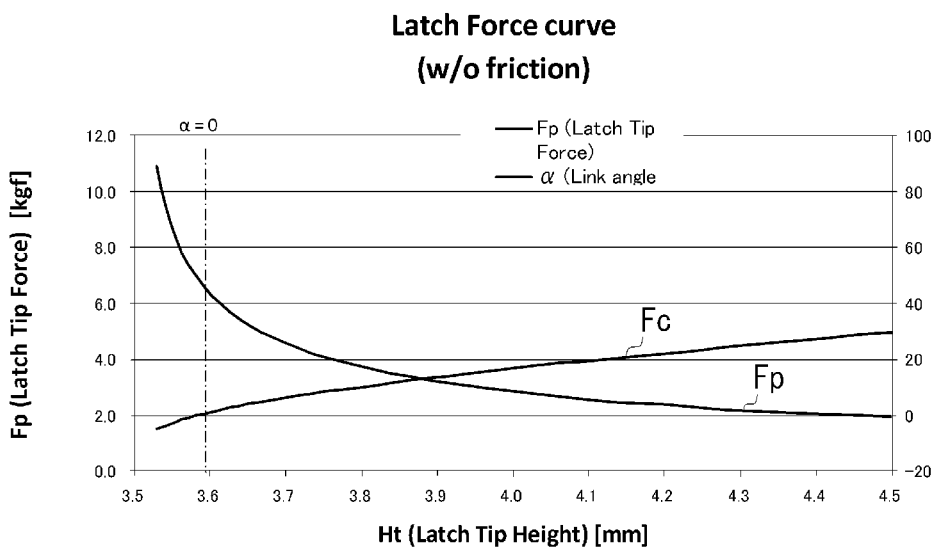

Now, the operation and the balance of the force of the latch mechanism according to one embodiment will be described. FIG. 17 shows that the link member 500, the latch member 600 and the lever member 700 are connected each other. FIGS. 18(A) and 18(B) are graphs indicating the operation of the respective portions with the latch mechanism designed at a preferred value according to the embodiment.

As shown in FIG. 17, the axis 740 is inserted into the long hole 712 of the first extending portion 710 of the lever member 700 and then the cover member 300 and the first extending portion 710 are connected by the axis 740. The axis 750 is inserted into the through hole 732 of the crossing portion 730 and then the crossing portion 730 and the base member 200 are connected by the axis 750. The axis 760 is inserted into the through hole 722 of the second extending portion 720 and then the second extending portion 720 and the narrow portion 630 of the latch member 600 are connected by the axis 760. The first end 510 of the link member 500 and the cover member 300 are connected by the axis 540, while the second end 520 of the link member and the pressing portion 620 of the latch member 600 are connected by the axis 500.

The operating force Fc applied to the cover member 300 is the sum of the reaction force F1 from the first extending portion 710 and the reaction force F2 from the first end 510 of the link member 500 (Fc=F1+F2). FIG. 18(A) shows the relation between the stroke of the cover member and the operating force Fc, it can be seen that the operating force Fc is substantially constant while it increases slightly according to the distance of the stroke of the cover member. FIG. 18(A) also shows the travel distances Xd and Yd by which the tip end of the latch member moves respectively in the X-direction and the Y-direction, and the pressing force Fq of the pressing portion 620, in the relation of the stroke distance of the cover member 300.

A graph in FIG. 18(B) shows the relation between the pressing force Fq of the pressing portion 620 and the hight Ht from the axis 750 to the pressing portion 620. It is understood that the pressing force Fq increases rapidly when the height Ht is lower than 3.7 mm. In other words, when the pressing portion 620 contacts to a semiconductor package within a range in which the height Ht is lower than 3.7 mm, a relatively-large force Fq may be obtained. More preferably, the pressing portion 620 presses when the pressing portion 620 moves to the semiconductor package substantially in a vertical direction or the angle of the link member 500 is substantially horizontal. The angle α of the link members 500 is defined as the crossing angle that a straight line passing the axis 540 and the axis 550 is intersects with the X-direction. When the angle α of the link member 500 is close to 0, a relatively-large force of the latch member may be obtained so that the torque to the link member 500 is minimized.

As described above, a socket according to the present invention may provide the advantages below.
1. A force that is increased by a lever member is used for pressing down a semiconductor package. Thus, a force for pressing down a semiconductor package may be generated due to a light load of a coil spring (operating force) so that the outer dimensions of the socket may be reduced.
2. A link member that restrict a profile of a latch member is used. Thus, the link member may be horizontal to be pressed substantially vertically when a semiconductor package is pressed, while the link member may be vertical to be retracted when a semiconductor package is inserted.
3. By making the angle of the link member to be above horizontal (above a dead center position), the force may be magnified more than the leverage of the lever member so that the operating force may be reduced.

The preferred embodiments of the present invention are described in detail above. The present invention is not limited to the particular embodiments. Various changes and modifications may be made without departing from the spirit and scope of the present invention.

DESCRIPTION OF THE REFERENCE NUMERALS

200: base member
210: engaging groove
220: coil spring
230: opening
240: side wall
242: groove
250: accommodating groove
260: side surface
262: support hole
270: space
300: cover member
310: hook
312: claw
320: opening
330: side wall
340: space
342: slit
344: groove
350: support hole
400: adaptor
410: mounting surface
420: hook
430: through hole
440: guide portion
500: link member
510: first end
512: through hole
520: second end
522: through hole
530: connecting portion
540: rotational axis
600: latch member
610, 612: side surface
620: pressing portion
622: through hole
630: narrow portion
632: through hole
700: lever member
710: first extending portion
712: longitudinal hole
720: second extending portion
722: through hole
730: crossing portion
732: through hole
740: axis
750: axis
800: latch plate
810: side wall
812: groove
820: connecting portion
822: bottom surface
830: space

What is claimed is:

1. A socket comprising:
a base member for holding a plurality of contacts;
a cover member movable in a direction to be close to or separated from the base member;
a latch member having a pressing portion at a first end thereof, the pressing portion pressable on an electronic device placed on the base member to be pressed;
a link member, a first end of the link member connected with the cover member, a second end of the link member connected with the first end of the latch member; and
a lever member rotatable fixed to the base member, a first end of the lever member connected with the cover member, a second end of the lever member connected with the second end of the latch member opposed to the first end of the latch member;
wherein the link member and the lever member move the pressing portion of the latch member to an evacuated position when the cover member moves in a direction to be close to the base member, and
the link member and the lever member move the pressing portion of the latch member to a position where the electronic device can be pressed when the cover member moves in a direction to be separated from the base member.

2. The socket according to claim 1, wherein the distance from a rotation center to the first end of the lever member is longer than the rotation center to the second end of the lever member.

3. The socket according to claim 1, wherein the latch member comprises a pair of latch members, and a pair of link members is disposed at the both sides of the pair of latch members.

4. The socket according to claim 1, wherein the latch member comprises a first surface and a second surface opposite to the first surface, the pressing portion is formed between the first surface and the second surface, a first through hole is formed to penetrate from the first surface to the second surface, the link member is disposed at a first side surface and a second side surface of the latch member respectively, and an axis inserted into the first through hole allows the latch member and the pair of link members to be rotatably connected each other.

5. The socket according to claim 1, wherein a second through hole is formed at the second end opposite to the pressing portion of the latch member, the lever member is disposed at the first side surface and the second side surface respectively, and an axis inserted into the second through hole allows the latch member and the pair of lever members to be rotatably connected to each other.

6. The socket according to claim 1, wherein a longitudinal hole is formed at one end of the lever member, and the lever member is connected with the cover member through an axis inserted into the longitudinal hole.

7. The socket according to claim 1, wherein the angle of the link member is within a range including a horizontal angle when the pressing portion of the latch member presses the electronic device.

8. The socket according to claim 7, wherein the angle of the link member is the angle that a direction extending from the first end to the second end of the link member intersects with a horizontal direction.

9. The socket according to claim 1, wherein the link member, the latch member and the lever member are designed such that the pressing portion contacts with the electronic device when the height from the second end of the link member to the rotation center of the lever member is lower than a predetermined range.

10. The socket according to claim 1, wherein an elastic member is disposed between the cover member and the base member, the elastic member energize the cover member in a direction to be separated from the base member.

11. The socket according to claim 1, further comprising a latch plate for covering the latch member, the latch plate provided with a flat surface for pressing the electronic device.

12. The socket according to claim 1, further comprising an adaptor for providing a mounting surface for the electronic device, the adaptor elastically supported, wherein the adaptor descends when the latch member presses the electronic device so that the top end of the contact protrude from the mounting surface.

13. The socket according to claim 2, wherein the latch member comprises a pair of latch members, and a pair of link members is disposed at the both sides of the pair of latch members.

14. The socket according to claim 2, wherein the latch member comprises a first surface and a second surface opposite to the first surface, the pressing portion is formed between the first surface and the second surface, a first through hole is formed to penetrate from the first surface to the second surface, the link member is disposed at a first side surface and a second side surface of the latch member respectively, and an axis inserted into the first through hole allows the latch member and the pair of link members to be rotatably connected each other.

15. The socket according to claim 3, wherein the latch member comprises a first surface and a second surface opposite to the first surface, the pressing portion is formed between the first surface and the second surface, a first through hole is formed to penetrate from the first surface to the second surface, the link member is disposed at a first side surface and a second side surface of the latch member respectively, and an axis inserted into the first through hole allows the latch member and the pair of link members to be rotatably connected each other.

16. The socket according to claim 2, wherein a second through hole is formed at the second end opposite to the pressing portion of the latch member, the lever member is disposed at the first side surface and the second side surface respectively, and an axis inserted into the second through hole allows the latch member and the pair of lever members to be rotatably connected to each other.

17. The socket according to claim 3, wherein a second through hole is formed at the second end opposite to the pressing portion of the latch member, the lever member is disposed at the first side surface and the second side surface respectively, and an axis inserted into the second through hole allows the latch member and the pair of lever members to be rotatably connected to each other.

18. The socket according to claim 4, wherein a second through hole is formed at the second end opposite to the pressing portion of the latch member, the lever member is disposed at the first side surface and the second side surface respectively, and an axis inserted into the second through hole allows the latch member and the pair of lever members to be rotatably connected to each other.

19. The socket according to claim 3, wherein the link member, the latch member and the lever member are designed such that the pressing portion contacts with the electronic device when the height from the second end of the link member to the rotation center of the lever member is lower than a predetermined range.

20. The socket according to claim 4, wherein the link member, the latch member and the lever member are designed such that the pressing portion contacts with the electronic device when the height from the second end of the link member to the rotation center of the lever member is lower than a predetermined range.

* * * * *